(12) United States Patent
Bostak et al.

(10) Patent No.: US 7,123,104 B2
(45) Date of Patent: Oct. 17, 2006

(54) SYSTEM AND METHOD FOR MEASURING CURRENT

(75) Inventors: Christopher J. Bostak, Fort Collins, CO (US); Samuel D. Naffziger, Fort Collins, CO (US); Christopher A. Poirier, Fort Collins, CO (US); Eric S. Fetzer, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/644,542

(22) Filed: Aug. 20, 2003

(65) Prior Publication Data

US 2005/0040901 A1 Feb. 24, 2005

(51) Int. Cl.
*H03B 5/24* (2006.01)
*G01R 19/00* (2006.01)
*H03K 17/296* (2006.01)

(52) U.S. Cl. .............. 331/57; 331/177 R; 324/123; 324/124; 327/394; 327/395; 327/396

(58) Field of Classification Search ............ 331/57, 331/74, 75, 177 R; 327/101, 237, 250–251, 327/261, 276–278, 281, 285, 288, 365, 392–396, 327/399–401; 324/76.11, 123–124
See application file for complete search history.

(56) References Cited

U.S. PATENT DOCUMENTS 4,315,316 A * 2/1982 Boros et al. ............... 702/64
5,111,502 A 5/1992 McClure et al.
5,365,204 A * 11/1994 Angiulli et al. ............. 331/57
6,271,730 B1 8/2001 Abe et al.
6,504,439 B1 * 1/2003 Ozawa et al. .............. 331/57

FOREIGN PATENT DOCUMENTS

| DE | 16 16 087 | 1/1976 |
|---|---|---|
| GB | 2 262 349 | 6/1993 |
| GB | 2 338 311 | 12/1999 |
| GB | 2 395 020 | 5/2004 |

OTHER PUBLICATIONS

U.S. Appl. No. 10/644,559, Bostak et al.
U.S. Appl. No. 10/644,625, Poirier et al.
U.S. Appl. No. 10/644,376, Poirier et al.
Foreign Search Report issued for GB 0 41 7997.4, dated Jan. 5, 2005.
English translation of the Office Action issued for 10 2004 0188 636.7-35, dated Jul. 22, 2005.

* cited by examiner

*Primary Examiner*—David Mis

(57) ABSTRACT

The present invention is directed to a system and method for measuring a current in an integrated circuit comprising measuring a first output count from a first voltage controlled oscillator (VCO) using a first measurement voltage, simultaneously measuring a second output count from a second VCO using a second measurement voltage, and calculating the current in the integrated circuit using a voltage proportional to a difference between the first and second output counts.

20 Claims, 1 Drawing Sheet

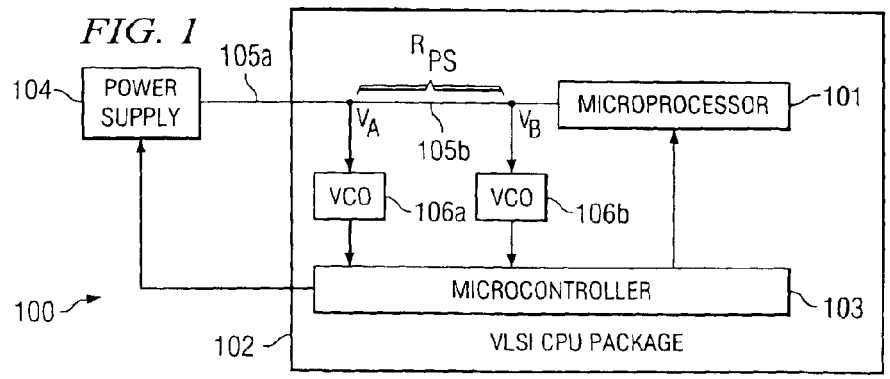
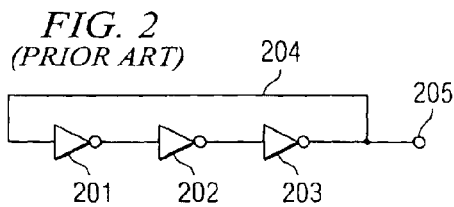

SYSTEM AND METHOD FOR MEASURING CURRENT

CROSS-REFERENCE TO RELATED APPLICATIONS

This application is related to U.S. patent application Ser. No. 10/644,559, entitled "METHOD AND SYSTEM FOR CALIBRATION OF A VOLTAGE CONTROLLED OSCILLATOR (VCO);" U.S. patent application Ser. No. 10/644,625, entitled "A SYSTEM FOR AND METHOD OF CONTROLLING A VLSI ENVIRONMENT;" and U.S. patent application Ser. No. 10/644376, entitled "A METHOD FOR MEASURING INTEGRATED CIRCUIT PROCESSOR POWER DEMAND AND ASSOCIATED SYSTEM," filed concurrently herewith, the disclosures of which are hereby incorporated by reference herein in their entirety.

BACKGROUND

Traditionally, a microprocessor's average current draw is monitored by converting analog values of current to digital values that can be used by the microprocessor. This required some form of analog-to-digital (A/D) converter and an averaging circuit. The standard method of measuring current involves sending the current through a known "sense" resistance and measuring the voltage drop across the resistor. The known resistance and measured voltage can be plugged into Ohm's law (I=V/R) to calculate the current.

This method involves the design of an A/D converter for measurement of the voltages on both sides of the sense resistor. Using a discrete, off-die A/D converter to measure the voltage drop requires a separate component that is on or very near the microprocessor package, which increases the microprocessor package cost. Furthermore a separate interface is needed between the microprocessor and the A/D converter, which further complicates the design.

An alternative design is to put the A/D converter into the package, which would be a very complicated process and is likely to yield relatively inaccurate results in a digital integrated circuit manufacturing process by which the microprocessor is fabricated. The addition of the sense resistor also wastes power by dissipating power in the resistor instead of putting it to useful work in the circuit.

SUMMARY

An embodiment of the invention is directed to a method for measuring a current in an integrated circuit comprising measuring a first output count from a voltage controlled oscillator (VCO) using a first measurement voltage, measuring a second output count from the VCO using a second measurement voltage, and calculating the current in the integrated circuit using a voltage proportional to a difference between the first and second output counts.

Another embodiment of the invention is directed to a system for monitoring the current in an integrated circuit comprising an integrated circuit power supply line having a first measurement point and a second measurement point, two voltage controlled oscillators (VCO) having control inputs adapted to be coupled to the first and second measurement points respectively, and counters coupled to the outputs of the VCOs.

A further embodiment of the invention is directed to a circuit comprising an inverter, a pass gate circuit coupled to an output of the inverter and operating to allow current to flow in an amount proportional to a control voltage, and an amplifier coupled to the output of the pass gate circuit.

An additional embodiment of the invention is directed to a voltage controlled oscillator (VCO) comprising three stages connected together in a ring, wherein each stage comprises an inverter, a pass gate circuit coupled to an output of the inverter and operating to allow current to flow in an amount proportional to a control voltage, and an amplifier coupled to the output of the pass gate circuit; a control voltage input coupled to the pass gate circuit of each stage; and an output between two of the stages.

BRIEF DESCRIPTION OF THE DRAWINGS

FIG. 1 is a block diagram of a CPU incorporating an embodiment of the present invention;

FIG. 2 is a block diagram of a prior art ring oscillator;

FIG. 3 is a schematic diagram of a single stage of a ring oscillator for use in an embodiment of the invention; and FIG. 4 illustrates a three-stage ring oscillator incorporating the circuit of FIG. 3.

DETAILED DESCRIPTION

The present invention uses the microprocessor package resistance as the sense resistor, which results in no additional power loss in the circuit. Instead of using a separate sense resistor, an ammeter according to the invention uses the inherent parasitic resistance in the package. The voltage drop is measured across this inherent package resistance, which eliminates the need for a separate sense resistor and saves both board space and power.

The present invention also uses an on-die, high-gain voltage controlled oscillator (VCO) and a digital counter instead of a separate A/D converter to perform both magnitude and averaging functions of the voltage measurement. The input port for the voltage measurement circuit is the control port of the VCO. The frequency of the VCO is proportional to the control voltage input. The counter is used to count the frequency of the VCO for a fixed time interval. The control voltage can be inferred from the frequency count through calibration of the VCO circuit. By running the counter over a significant period of time this method also provides average readings over the time interval of interest, thereby saving additional averaging circuitry.

The invention may use a new high-gain VCO that provides high resolution measurements. The VCO used in one embodiment is a standard ring oscillator that has a novel pass gate at each stage to limit the current at the output of an inverter. This provides greater gain for the VCO, which translates to more accurate measurement resolution in the circuit.

FIG. 1 is a block diagram of CPU 100 incorporating an embodiment of the present invention. Microprocessor 101 is constructed on VLSI CPU package 102. Microcontroller 103 is also constructed on VLSI CPU die 102. Microcontroller 103 monitors and controls the VLSI environment to optimize the operation of microprocessor 101. One of the parameters that is monitored and controlled by microcontroller 103 is the CPU's power demand level.

CPU 100 is designed to operate at some maximum power level. The operating frequency—or the number of instructions that are being processed per second in CPU 100—is related to the CPU's power level. A higher power level is required for the CPU to operate at higher operating frequencies. Microcontroller 103 monitors the power level and controls the VLSI environment to optimize the power level and operating frequency in microprocessor 101.

Power supply 104 provides current to microprocessor 101 via power supply grid 105a, 105b. The power demand level for microprocessor 101 can be determined from the current that is provided via power supply grid 105a, 105b. If the current through power supply line 105b is measured, then the power demand for microprocessor 101 can be determined. In an embodiment of the invention, the current through from the power supply is calculated by measuring the voltage drop across line 105b.

The two VCOs 106a,b are used to monitor the voltages $V_A$, $V_8$ at either end of power supply line 105b. From these voltages, the voltage drop ($V_B - V_A$) across line 105b can be calculated. Using the inherent resistance $R_{ps}$ of line 105b, the current through line 105b can then be calculated using Ohm's Law ($I=(V_B - V_A)R_{PS}$). The value of resistance $R_{PS}$ across line 105b must be known to make this calculation. One way to determine inherent resistance RPS is to apply a known current ($I_{known}$) through line 105b and then measure the voltage drop across line 105b at that current level. Again, Ohm's law can be used to calculate the resistance using those values (Rps $=(V_B - V_A)/I_{known}$). Other methods of and systems for measuring the inherent resistance in the CPU package are disclosed in U.S. patent application Ser. No. 10/644,376, entitled "A METHOD FOR MEASURING INTEGRATED CIRCUIT PROCESSOR POWER DEMAND AND ASSOCIATED SYSTEM," filed concurrently herewith, the disclosure of which is incorporated by reference herein. The use of inherent resistance $R_{PS}$ across line 105b avoids the need to have a separate, discrete resistor component for the current measurements.

Traditional voltage measurements required the use of an A/D converter to convert the measurements into a digital format that could be used for the power calculations. In the present invention, VCOs 106a,b act as an A/D converter and provides a digital signal representing voltages to microcontroller 103.

The output of VCOs 106a,b is proportional to the input control voltage. As the control voltage is increased, the output frequency of VCOs 106a,b increases. The output frequency of VCOs 106a,b can be counted over a specified interval using a digital counter. The output count (a digital value) is proportional to the input voltage (an analog value). Therefore, the VCO/digital counter combination acts like an A/D converter.

Microcontroller 103 may act as the digital counter for VCOs 106a,b. When VCO 106a is connected to input voltage $V_A$, microcontroller 103 will count a first number of pulses from VCO 106 over the count interval. VCO 106b is simultaneously connected to input voltage VB, and microcontroller 103 also counts a second number of pulses during the count interval. The difference between the two output counts is a digital value that is proportional to the voltage drop across power supply line 105b and that can be used by microcontroller 103 for the current and power calculations.

The inherent resistance is expected to be a very small value and, therefore the voltage drop across the resistance is expected to also be very small, for example, on the order of 10–20 mV. The VCO must have a high gain so that a significant count difference is generated between voltages $V_A$ and $V_B$. VCO 106 may be a three-stage ring oscillator that operates at approximately 10 GHz so that a sufficient count difference is generated over an 8 microsecond measurement period.

FIG. 2 is a block diagram of prior art ring oscillator 200 in which three inverters 201–203 are connected in series so that signals out of inverter 203 continue to loop back to inverter 201 through line 204. Oscillator 200 generates a constant-frequency output signal at output 205. The design of oscillator 200 can be modified by placing a pass gate at the output of each inverter stage wherein the pass gate limits current flow through the circuit based upon a control voltage. Such a oscillator may be used as VCO 106 in FIG. 1.

FIG. 3 is a schematic diagram of a single stage of a ring oscillator for use in an embodiment of the invention. Circuit 300 consists of three parts: inverter 301, pass gate 302 and amplifier 303. Inverter 301 consists of PFET transistor 304 and NFET transistor 305, which are configured to invert input signals at node 306 so that an inverted signal is output to node 307.

Circuit 300 includes novel pass gate 302, which functions to limit the current that flows through the circuit. Pass gate 302 consists of NFET 308 coupled to the input control voltage $V_{IN}$ and PFET 309 is coupled to an inverted control voltage $V_{INb}$. As control voltage $V_{IN}$ increases and inverted control voltage $V_{INb}$ decreases, transistors 308 and 309 are more "on" which allows more current to pass from node 307 to 310. This means that as $V_{IN}$ increases and $V_{INb}$ decreases, circuit 300 will switch at a faster rate. Amplifier section 303, consisting of PFET 311 and NFET 312, amplifies the signal from pass gate 302 at node 310 to the output of circuit 300 at node 313.

Circuit 300 can be used to replace the individual inverters 201–203 of FIG. 2 to form three-stage VCO 400 as illustrated in FIG. 4. Oscillator 400 will produce output pulses at a set frequency at 401 for a particular input voltage $V_{IN}$. As the voltage $V_{IN}$ is increased, more current flows through each stage 300 and the transistors in each stage switch at a faster rate, which causes the output signal at 401 to increase in frequency. Likewise, if the control current $V_{IN}$ is decreased, then the output frequency count decreases at 401.

Oscillator 400 can be used as VCO 106 (FIG. 1) wherein the voltages from measurement points $V_A$ and $V_B$ are applied as input voltage $V_{IN}$. The output signal 401 is then counted by microcontroller 103, for example, for a set measurement interval, such as 8 microseconds. In one embodiment, oscillator 400 operates at approximately 10 GHz and has a gain on the order of 20 GHz/Volt. These parameters are expected to provide a sufficient difference in counts at measurement points $V_A$ and $V_B$ across inherent resistance $R_{PS}$ so that a voltage drop can be detected and quantified for use in the current and power calculations.

It will be understood that although the VCO described herein is used to measure the current drawn by a microprocessor, the present invention can be used to measure voltages and current in any integrated circuit.

What is claimed is:

1. A method for measuring a current in an integrated circuit comprising:

simultaneously measuring a first output count from a first voltage controlled oscillator (VCO) using a first measurement voltage, and a second output count from a second VCO using a second measurement voltage; and calculating the current in the integrated circuit using a voltage equivalent to a difference between the first and second output counts.

2. The method of claim 1 wherein the first measurement voltage and the second measurement voltage are associated with opposite sides of a resistance.

3. The method of claim 2 wherein the resistance is an inherent resistance in the integrated circuit package.

4. The method of claim 2 wherein the inherent resistance is measured by measuring a voltage drop across the inherent resistance while applying a known current through the inherent resistance.

5. The method of claim 1 wherein the first measurement voltage and the second measurement voltage are associated with points on an integrated circuit power supply grid.

6. The method of claim 1 further comprising:
controlling a power supply current based upon a calculated integrated circuit current.

7. A system for monitoring the current in an integrated circuit comprising:
an integrated circuit power supply line having a first measurement point and a second measurement point;
a voltage controlled oscillator (VCO) having a control input adapted to be alternatively coupled to the first and second measurement points; and
a counter coupled to an output of the VCO.

8. The system of claim 7 further comprising:
a controller coupled to the counter and adapted to calculate a difference in VCO counts for the first and second measurement points.

9. The system of claim 8 wherein the power supply line has a known inherent resistance and wherein the controller calculates a current demand in the integrated circuit.

10. The system of claim 8 wherein the controller adjusts a power supply current.

11. A circuit comprising:
an inverter;
a pass gate circuit coupled to an output of the inverter and operating to allow current to flow in an amount proportional to a control voltage; and
an amplifier coupled to the output of the pass gate circuit.

12. The circuit of claim 11 wherein the pass gate circuit comprises:
a PFET transistor having a gate coupled to the control voltage; and
an NFET transistor having a gate coupled to an inverted control voltage;
wherein a source of the PFET transistor and a source of the NFET transistor are coupled to the inverter, and a drain of the PFET transistor and a drain of the NFET transistor are coupled to the amplifier.

13. The circuit of claim 12 wherein a higher level of current is allowed to flow in the circuit as the control voltage is increased.

14. The circuit of claim 11 wherein the circuit represents a first stage of an oscillator and further comprising:
a second stage identical to the first stage and coupled to an output of the first stage; and
a third stage identical to the first stage and coupled to an output of the second stage, and an output of the third stage coupled to an input of the first stage.

15. A voltage controlled oscillator (VCO) comprising:
three stages connected together in a ring, wherein each stage comprises:
an inverter;
a pass gate circuit coupled to an output of the inverter and operating to allow current to flow in an amount proportional to a control voltage; and
an amplifier coupled to the output of the pass gate circuit;
a control voltage input coupled to the pass gate circuit of each stage; and
an output between two of the stages.

16. The VCO of claim 15 wherein signals circulate through the three-stage ring at a rate proportional to the control voltage.

17. The VCO of claim 15 wherein a signal at the output has a frequency proportional to the control voltage.

18. The VCO of claim 15 further comprising:
a counter coupled to the output.

19. The VCO of claim 17 wherein the counter counts output pulses over a selected interval of time.

20. The VCO of claim 18 further comprising:
a controller coupled to the counter; and
wherein the controller associates an output count with a voltage level.

* * * * *

UNITED STATES PATENT AND TRADEMARK OFFICE
CERTIFICATE OF CORRECTION

| | | |
|---|---|---|
| PATENT NO. | : 7,123,104 B2 | Page 1 of 1 |
| APPLICATION NO. | : 10/644542 | |
| DATED | : October 17, 2006 | |
| INVENTOR(S) | : Christopher J. Bostak et al. | |

It is certified that error appears in the above-identified patent and that said Letters Patent is hereby corrected as shown below:

In column 3, line 9, delete "$V_8$" and insert -- $V_B$ --, therefor.

In column 3, line 13, delete "(I=($V_B$ - $V_A$)$R_{PS}$)" and insert -- (I=($V_B$ - $V_A$)/$R_{PS}$) --, therefor.

Signed and Sealed this

Sixth Day of January, 2009

JON W. DUDAS
*Director of the United States Patent and Trademark Office*